United States Patent
Kim

(10) Patent No.: US 10,699,762 B2
(45) Date of Patent: Jun. 30, 2020

(54) CYCLE CONTROL CIRCUITS

(71) Applicant: SK hynix Inc., Icheon-si, Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 314 days.

(21) Appl. No.: 15/862,872

(22) Filed: Jan. 5, 2018

(65) Prior Publication Data
US 2019/0057730 A1 Feb. 21, 2019

(30) Foreign Application Priority Data

Aug. 21, 2017 (KR) .................. 10-2017-0105272

(51) Int. Cl.

| | |
|---|---|
| *G11C 8/18* | (2006.01) |
| *G06F 1/04* | (2006.01) |
| *G06F 9/38* | (2018.01) |
| *G11C 7/10* | (2006.01) |
| *G11C 11/419* | (2006.01) |
| *G11C 7/22* | (2006.01) |
| *G06F 1/3234* | (2019.01) |
| *G11C 8/06* | (2006.01) |
| *G06F 13/42* | (2006.01) |

(52) U.S. Cl.
CPC .................. *G11C 8/18* (2013.01); *G06F 1/04* (2013.01); *G06F 1/3243* (2013.01); *G06F 9/3869* (2013.01); *G06F 13/4217* (2013.01); *G11C 7/1063* (2013.01); *G11C 7/222* (2013.01); *G11C 8/06* (2013.01); *G11C 11/419* (2013.01)

(58) Field of Classification Search
CPC ......... G11C 8/18; G11C 7/1063; G11C 7/222; G11C 8/06; G11C 11/419; G06F 1/04; G06F 1/3243; G06F 9/3869; G06F 13/4217
See application file for complete search history.

(56) References Cited

U.S. PATENT DOCUMENTS

| | | | |
|---|---|---|---|
| 6,166,990 A * | 12/2000 | Ooishi | ............ G11C 7/22 365/194 |
| 8,610,479 B2 | 12/2013 | Lee et al. | |
| 2012/0007652 A1* | 1/2012 | Li | ............ H03M 1/1014 327/362 |

(Continued)

FOREIGN PATENT DOCUMENTS

| | | |
|---|---|---|
| KR | 1020160149717 A | 12/2016 |
| KR | 1020170009291 A | 1/2017 |

*Primary Examiner* — Jaweed A Abbaszadeh
*Assistant Examiner* — Gayathri Sampath
(74) *Attorney, Agent, or Firm* — William Park & Associates Ltd.

(57) ABSTRACT

A cycle control circuit may include a judgement pulse generation circuit, a detection signal generation circuit or a flag generation circuit. The judgement pulse generation circuit may be configured to set a predetermined value based on an initialization signal and a period signal, and to generate a judgment pulse. The detection signal generation circuit may be configured to generate a detection signal from a reference flag. The flag generation circuit may be configured to generate a reference flag based on a reference signal. A cycle of the reference signal may be maintained or adjusted based on the reference flag.

26 Claims, 17 Drawing Sheets

(56) References Cited

U.S. PATENT DOCUMENTS

2015/0316952 A1* 11/2015 Priel .................... G06F 1/10
  327/291
2016/0041212 A1* 2/2016 Darbinyan ......... G01R 29/0273
  327/33

* cited by examiner

FIG.4

| OP<4:1> | INT<5:1> |
|---------|----------|
| '1000'  | '00000'  |
| '1001'  | '00010'  |
| '1010'  | '00100'  |
| '1011'  | '00110'  |
| '1100'  | '01000'  |

CYCLE CONTROL CIRCUITS

CROSS-REFERENCE TO RELATED APPLICATIONS

The present application claims priority under 35 U.S.C 119(a) to Korean Patent Application No. 10-2017-0105272, filed on Aug. 21, 2017, which is herein incorporated by references in its entirety.

BACKGROUND

1. Technical Field

Embodiments of the present disclosure generally relate to circuits relating to controlling a cycle of a reference signal.

2. Related Art

Each electronic device may be realized using a plurality of transistors. Characteristics of the transistors may vary according to process, voltage, and temperature (PVT) conditions. For example, the characteristics of the transistors may be outside of allowable ranges due to critical dimension (CD) variations in a photolithography step and an etch step for forming gate electrodes of the transistors as well as due to an impurity dose variation in an implantation step for adjusting a threshold voltage of the transistors. In such a case, the performance of the electronic devices may be degraded, or the electronic devices may malfunction.

SUMMARY

According to an embodiment, a cycle control circuit may be provided. The cycle control circuit may include a judgement pulse generation circuit, a detection signal generation circuit, and a code generation circuit. The judgement pulse generation circuit may be configured to set a predetermined value in response to an initialization signal and generate a judgement pulse in synchronization with a point of time that a time period corresponding to the predetermined value in units of a cycle of a clock signal elapses. The detection signal generation circuit may be configured to generate a detection signal from a reference flag in response to the judgement pulse. The code generation circuit may be configured to generate a calibration code for controlling a cycle of a reference signal in response to the detection signal and the judgement pulse.

According to an embodiment, a cycle control circuit may include a judgement pulse generation circuit, a flag generation circuit, and a code generation circuit. The judgement pulse generation circuit may be configured to set a predetermined value in response to an initialization signal and generates a judgement pulse in synchronization with a point of time that a time period corresponding to the predetermined value in units of a cycle of a clock signal elapses. The flag generation circuit may be configured to generate a reference flag in response to a period signal and a reference signal having a cycle controlled by a calibration code. The code generation circuit may be configured to generate the calibration code and a sense code in response to the judgement pulse and a detection signal generated from the reference flag.

According to an embodiment, a cycle control circuit may include a judgement pulse generation circuit configured to set a predetermined value based on an initialization signal and a period signal, and configured to generate a judgement pulse in synchronization with a point of time that a time period corresponding to the predetermined value in units of a cycle of a clock signal elapses. The cycle control circuit may include a flag generation circuit configured to generate a reference flag based on the period signal and a reference signal. A cycle of the reference signal may be maintained at a constant value after an operation for adjusting the cycle of the reference signal terminates based on the reference flag.

According to an embodiment, a cycle control circuit may include a judgement pulse generation circuit configured to set a predetermined value based on an initialization signal and a period signal, and configured to generate a judgement pulse in synchronization with a point of time that a time period corresponding to the predetermined value in units of a cycle of a clock signal elapses. The cycle control circuit may include a detection signal generation circuit configured to generate a detection signal from a reference flag in response to the judgement pulse, the reference flag generated based on a reference signal and the period signal. A cycle of the reference signal may be maintained at a constant value after an operation for adjusting the cycle of the reference signal terminates based on the reference flag.

BRIEF DESCRIPTION OF THE DRAWINGS

FIG. 4 is a table illustrating an operation of the initialization signal generation circuit illustrated in FIG. 3.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to circuits for stably controlling a cycle of a reference signal.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations. Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
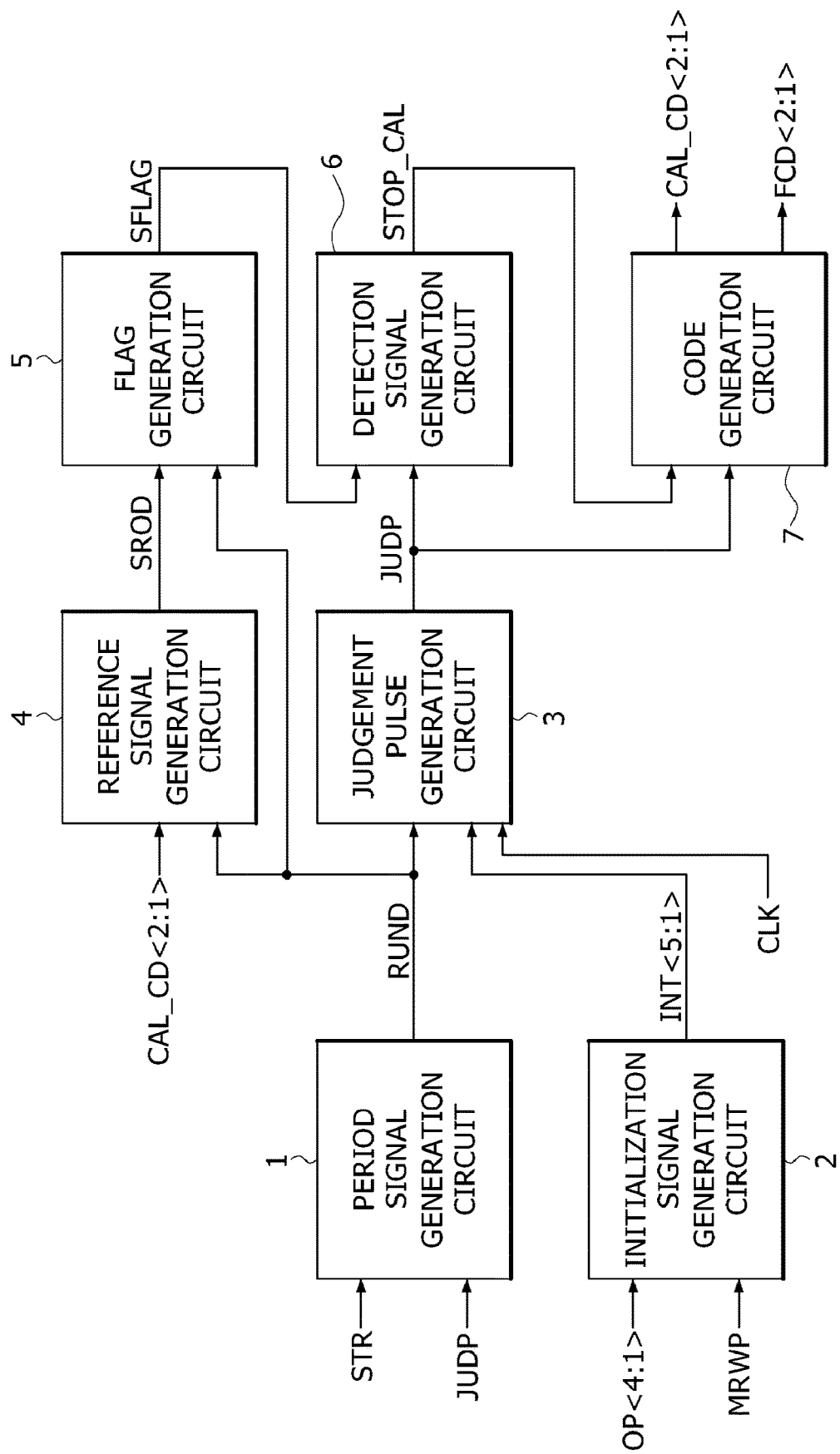
FIG. 1 is a block diagram illustrating a configuration of a cycle control circuit according to an embodiment of the present disclosure.

Referring to FIG. 1, a cycle control circuit according to an embodiment may include a period signal generation circuit 1, an initialization signal generation circuit 2, a judgement pulse generation circuit 3, a reference signal generation circuit 4, a flag generation circuit 5, a detection signal generation circuit 6, and a code generation circuit 7.

The period signal generation circuit 1 may generate a period signal RUND in response to a start signal STR and a judgement pulse JUDP. The period signal generation circuit 1 may generate the period signal RUND which is enabled if the start signal STR is enabled. A period signal RUND which is enabled means that the period signal RUND is set to have a predetermined logic level. A start signal STR which is enabled means that the start signal STR is set to have a predetermined logic level. The start signal STR may be enabled to commence a cycle control operation for controlling a cycle of a reference signal SROD. The start signal STR may be provided by an external device or may be generated in the cycle control circuit. A logic level of the start signal STR, which is enabled, may be set to be different according to the embodiments. The period signal generation circuit 1 may generate the period signal RUND which is disabled if the judgement pulse JUDP is generated. The judgement pulse JUDP may be generated by and outputted from the judgement pulse generation circuit 3. An operation of the judgement pulse generation circuit 3 for generating the judgement pulse JUDP will be described with reference to FIGS. 5 to 10 later. The period signal generation circuit 1 may generate the period signal RUND which is enabled during a period from a point of time that the start signal STR is enabled till a point of time that the judgement pulse JUDP is generated. A logic level of the period signal RUND, which is enabled, may be set to be different according to the embodiments. A configuration and an operation of the period signal generation circuit 1 will be described with reference to FIG. 2 later.

The initialization signal generation circuit 2 may generate an initialization signal INT<5:1> in response to an information signal OP<4:1> and a mode register write pulse MRWP. The mode register write pulse MRWP may be generated for a mode register write operation. The mode register write operation may be an operation for storing information (e.g., a latency and a burst length) on various modes into the initialization signal generation circuit 2. The initialization signal generation circuit 2 may store the information signal OP<4:1> therein and may generate the initialization signal INT<5:1>, if the mode register write pulse MRWP is generated. The information signal OP<4:1> may be set to include information on operation modes and may be inputted to the initialization signal generation circuit 2 through a line that transmits a command or an address. The information signal OP<4:1> may include the mode information. The number of bits included in the information signal OP<4:1> and the number of bits included in the initialization signal INT<5:1> may be set to be different according to the embodiments. A configuration and an operation of the initialization signal generation circuit 2 will be described with reference to FIGS. 3 and 4 later.

The judgement pulse generation circuit 3 may generate the judgement pulse JUDP in response to the period signal RUND, the initialization signal INT<5:1> and a clock signal CLK. The judgement pulse generation circuit 3 may generate the judgement pulse JUDP after a predetermined number of cycles of the clock signal CLK corresponding to a logic level combination of the initialization signal INT<5:1> elapses in a time period that the period signal RUND is enabled. For example, if the initialization signal INT<5:1> has a logic level combination of '00100' corresponding to a decimal number of '4', the judgement pulse generation circuit 3 may generate the judgement pulse JUDP after four cycles of the clock signal CLK elapses in a time period that the period signal RUND is enabled. A configuration and an operation of the judgement pulse generation circuit 3 will be described with reference to FIGS. 5 to 10 later.

The reference signal generation circuit 4 may generate the reference signal SROD in response to a calibration code CAL_CD<2:1> and the period signal RUND. The reference signal generation circuit 4 may generate the reference signal SROD corresponding to a periodic signal whose cycle is controlled according to a logic level combination of the calibration code CAL_CD<2:1>.

The flag generation circuit 5 may generate a reference flag SFLAG in response to the reference signal SROD and the period signal RUND. The flag generation circuit 5 may generate the reference flag SFLAG which is enabled in synchronization with a point of time that a predetermined number of cycles of the reference signal SROD elapses in a time period that the period signal RUND is enabled. A logic level of the reference flag SFLAG, which is enabled, may be set to be different according to the embodiments.

The detection signal generation circuit 6 may generate a detection signal STOP_CAL in response to the reference flag SFLAG and the judgement pulse JUDP. The detection signal generation circuit 6 may latch the reference flag SFLAG and may buffer the latched reference flag SFLAG to generate the detection signal STOP_CAL, at a point of time that the judgement pulse JUDP is generated.

The code generation circuit 7 may generate the calibration code CAL_CD<2:1> and a sense code FCD<2:1> in response to the detection signal STOP_CAL and the judgement pulse JUDP. The code generation circuit 7 may generate the calibration code CAL_CD<2:1> that is counted in response to the detection signal STOP_CAL and the judgement pulse JUDP. The code generation circuit 7 may output the calibration code CAL_CD<2:1> as the sense code FCD<2:1> in response to the detection signal STOP_CAL and the judgement pulse JUDP.

Figure 2:
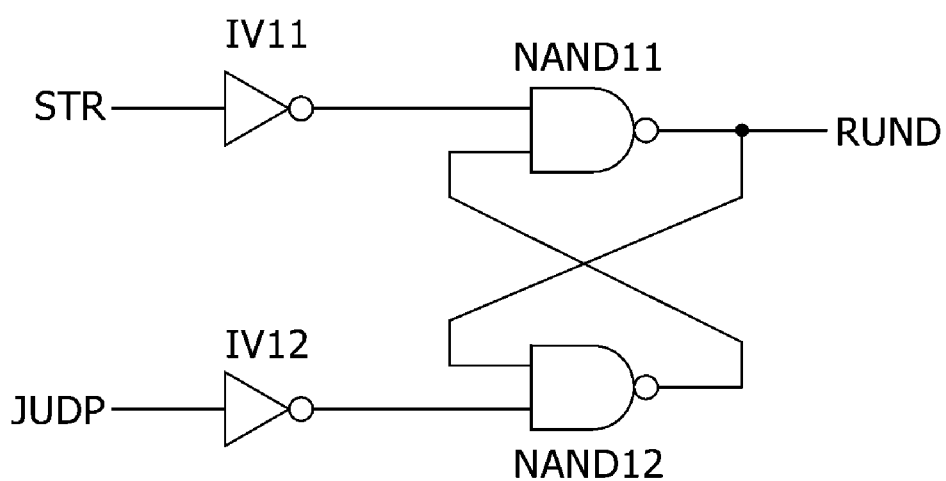
FIG. 2 is a circuit diagram illustrating an example of a period signal generation circuit included in the cycle control circuit of FIG. 1.

Referring to FIG. 2, the period signal generation circuit 1 may include inverters IV11 and IV12 and NAND gates NAND11 and NAND12. In an embodiment, for example, the NAND gates NAND11 and NAND12 may be coupled to one another to form an SR Latch of the NAND type, and the inverters IV11 and IV12 may be coupled to a respective NAND gate NAND11 and NAND12 as illustrated. The period signal generation circuit 1 may generate the period signal RUND which is enabled to have a logic "high" level if the start signal STR is enabled to have a logic "high" level. The period signal generation circuit 1 may generate the period signal RUND which is disabled to have a logic "low" level if the judgement pulse JUDP is generated. The period signal RUND may be enabled to have a logic "high" level in synchronization with a point of time that the start signal STR is enabled to have a logic "high" level and may be disabled to have a logic "low" level in synchronization with a point of time that the judgement pulse JUDP is generated.

Figure 3:
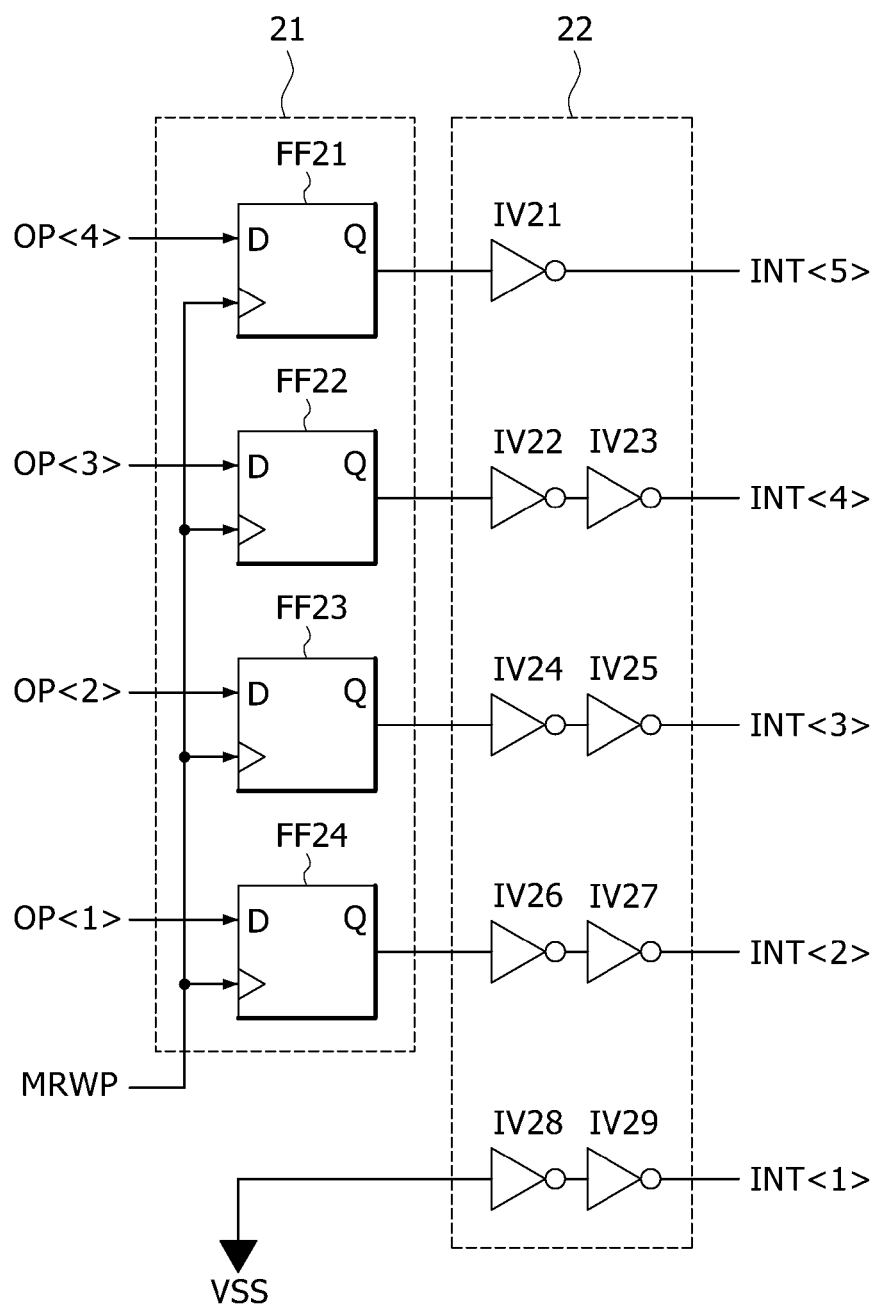
FIG. 3 is a circuit diagram illustrating an example of an initialization signal generation circuit included in the cycle control circuit of FIG. 1.

Referring to FIG. 3, the initialization signal generation circuit 2 may include an information input circuit 21 and an output buffer circuit 22. The information input circuit 21 may include first to fourth information flip-flops FF21, FF22, FF23 and FF24. In an embodiment, for example, each of the first to fourth information flip-flops FF21, FF22, FF23 and FF24 may include a D flip flop configured to receive the mode register write pulse with the clock terminal, to receive the bits of the information signal with the data D terminal, and to output the latched bits through the Q terminal. The output buffer circuit 22 may include inverters IV21~IV29. The first information flip-flop FF21 may latch a fourth bit datum OP<4> of the information signal OP<4:1> to output the latched fourth bit datum OP<4> if the mode register write pulse MRWP is generated. The inverter IV21 may inversely buffer an output signal of the first information flip-flop FF21 to generate a fifth bit datum INT<5> of the initialization signal INT<5:1>. The second information flip-flop FF22 may latch a third bit datum OP<3> of the information signal OP<4:1> to output the latched third bit datum OP<3> if the mode register write pulse MRWP is generated. The inverters IV22 and IV23 may buffer an output signal of the second information flip-flop FF22 to generate a fourth bit datum INT<4> of the initialization signal INT<5:1>. The third information flip-flop FF23 may latch a second bit datum OP<2> of the information signal OP<4:1> to output the latched second bit datum OP<2> if the mode register write pulse MRWP is generated. The inverters IV24 and IV25 may buffer an output signal of the third information flip-flop FF23 to generate a third bit datum INT<3> of the initialization signal INT<5:1>. The fourth information flip-flop FF24 may latch a first bit datum OP<1> of the information signal OP<4:1> to output the latched first bit datum OP<1> if the mode register write pulse MRWP is generated. The inverters IV26 and IV27 may buffer an output signal of the fourth information flip-flop FF24 to generate a second bit datum INT<2> of the initialization signal INT<5:1>. The inverters IV28 and IV29 may buffer a ground voltage VSS to generate a first bit datum INT<1> of the initialization signal INT<5:1>.

Referring to FIG. 4, a logic level combination of the initialization signal INT<5:1> generated by the initialization signal generation circuit 3 may be determined according to a logic level combination of the information signal OP<4:1>. If the information signal OP<4:1> has a logic level combination of '1000', the initialization signal INT<5:1> may be generated to have a logic level combination of '00000'. In the information signal OP<4:1>, a logic level combination of '1000' means that the fourth bit datum OP<4> has a logic "high" level and all of the first to third bit data OP<3:1> have a logic "low" level. In the initialization signal INT<5:1>, a logic level combination of '00000' means that all of the first to fifth bit data INT<5:1> have a logic "low" level. If the information signal OP<4:1> has a logic level combination of '1001', the initialization signal INT<5:1> may be generated to have a logic level combination of '00010'. In the information signal OP<4:1>, a logic level combination of '1001' means that the first and fourth bit data OP<1> and OP<4> have a logic "high" level and the second and third bit data OP<2> and OP<3> have a logic "low" level. In the initialization signal INT<5:1>, a logic level combination of '00010' means that the second bit datum INT<2> has a logic "high" level and the first bit datum INT<1> and the third to fifth bit data INT<3:5> have a logic "low" level. If the information signal OP<4:1> has a logic level combination of '1010', the initialization signal INT<5:1> may be generated to have a logic level combination of '00100'. If the information signal OP<4:1> has a logic level combination of '1011', the initialization signal INT<5:1> may be generated to have a logic level combination of '00110'. If the information signal OP<4:1> has a logic level combination of '1100', the initialization signal INT<5:1> may be generated to have a logic level combination of '01000'.

Figure 5:
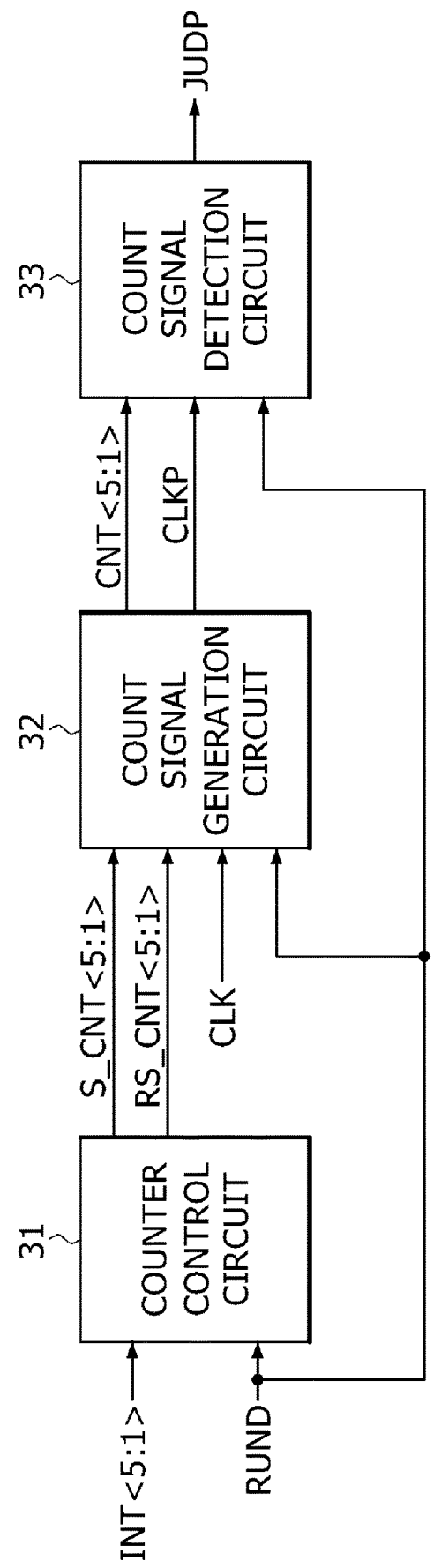
FIG. 5 is a block diagram illustrating an example of a judgement pulse generation circuit included in the cycle control circuit of FIG. 1.

Referring to FIG. 5, the judgement pulse generation circuit 3 may include a counter control circuit 31, a count signal generation circuit 32 and a count signal detection circuit 33.

The counter control circuit 31 may generate a set control signal S_CNT<5:1> and a reset control signal RS_CNT<5:1> in response to the initialization signal INT<5:1> and the period signal RUND. The counter control circuit 31 may buffer the initialization signal INT<5:1> to generate the set control signal S_CNT<5:1> and the reset control signal RS_CNT<5:1> while the period signal RUND is disabled. The counter control circuit 31 may generate the set control signal S_CNT<5:1> and the reset control signal RS_CNT<5:1> having predetermined logic level combinations if the period signal RUND is enabled. For example, if the period signal RUND is enabled, all of bits included in the set control signal S_CNT<5:1> may be set to have a logic "low" level and all of bits included in the reset control signal RS_CNT<5:1> may be set to have a logic "high" level. A configuration and an operation of the counter control circuit 31 will be described with reference to FIG. 6 later.

The count signal generation circuit 32 may generate a clock pulse CLKP and a count signal CNT<5:1> in response to the set control signal S_CNT<5:1>, the reset control signal RS_CNT<5:1>, the clock signal CLK and the period signal RUND. The count signal generation circuit 32 may generate the count signal CNT<5:1> having a predetermined initial logic level combination in response to the set control signal S_CNT<5:1> and the reset control signal RS_CNT<5:1> while the period signal RUND is disabled. The predetermined initial logic level combination of the count signal CNT<5:1> may be set to be different according to the embodiments. The count signal generation circuit 32 may generate the clock pulse CLKP from the clock signal CLK if the period signal RUND is enabled. The count signal generation circuit 32 may generate the count signal CNT<5: 1> which is sequentially counted in response to the clock pulse CLKP if the period signal RUND is enabled. A configuration and an operation of the count signal generation circuit 32 will be described with reference to FIG. 7 later.

The count signal detection circuit 33 may generate the judgement pulse JUDP in response to the count signal CNT<5:1>, the clock pulse CLKP and the period signal RUND. The count signal detection circuit 33 may generate the judgement pulse JUDP if the count signal CNT<5:1> is sequentially counted by the count signal generation circuit 32 in synchronization with the clock signal CLK to have a predetermined target logic level combination. The predetermined target logic level combination of the count signal CNT<5:1> may be set to be different according to the embodiments.

Figure 6:
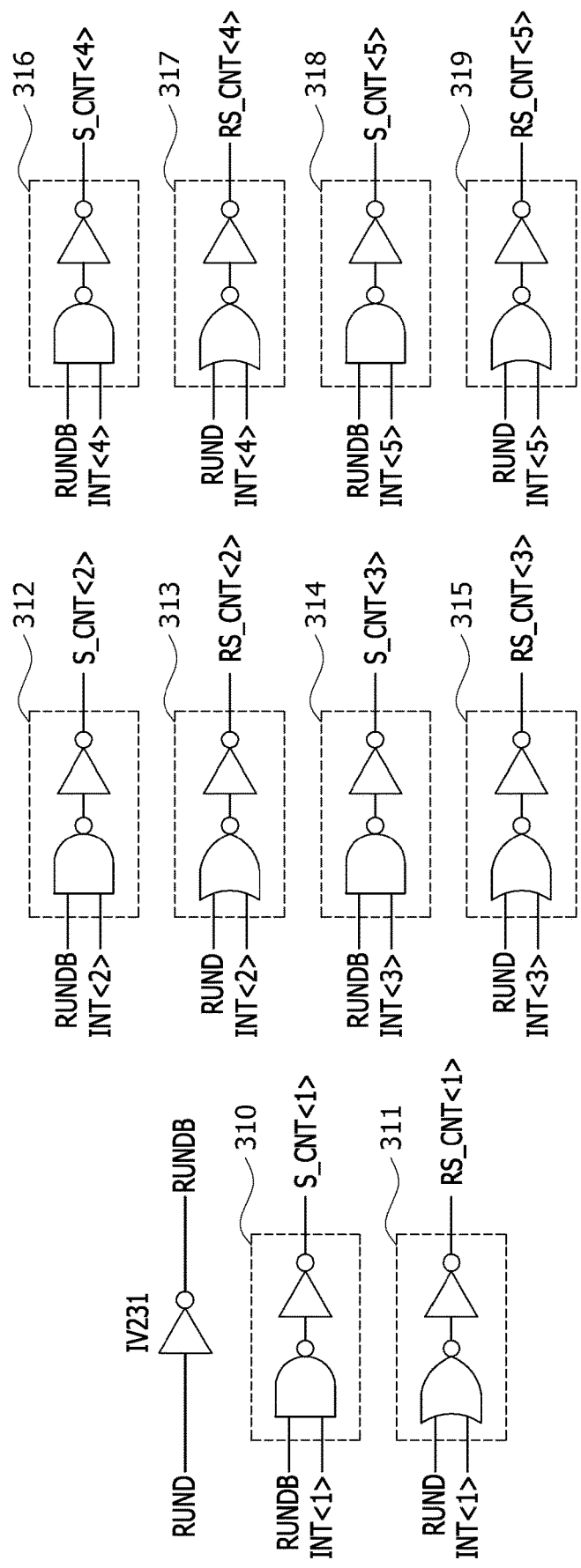
FIG. 6 is a circuit diagram illustrating an example of a counter control circuit included in the judgement pulse generation circuit of FIG. 5.

Referring to FIG. 6, the counter control circuit 31 may include an inverter IV231, a first set control circuit 310, a first reset control circuit 311, a second set control circuit 312, a second reset control circuit 313, a third set control circuit 314, a third reset control circuit 315, a fourth set control circuit 316, a fourth reset control circuit 317, a fifth set control circuit 318 and a fifth reset control circuit 319. The inverter IV231 may inversely buffer the period signal RUND to generate a complementary period signal RUNDB. If the period signal RUND is enabled to have a logic "high" level, the complementary period signal RUNDB may be enabled to have a logic "low" level. If the period signal RUND is disabled to have a logic "low" level, the complementary period signal RUNDB may be disabled to have a logic "high" level. In an embodiment, for example, the set control circuits (i.e., 310, 312, 314, 316, and 318) may each include a NAND gate for receiving the bits of the initialization signal INT and the complementary period signal RUNDB to output a resultant signal to an inverter for outputting a bit of the set control signal S_CNT<5:1>. In an embodiment, for example, the reset control circuits (i.e., 311, 313, 315, 317, and 319) may each include a NOR gate for receiving the bits of the initialization signal INT and the period signal RUND to output a resultant signal to an inverter for outputting a bit of the reset control signal <5:1>.

The first set control circuit 310 may buffer the first bit datum INT<1> of the initialization signal INT<5:1> to generate the first bit datum S_CNT<1> of the set control signal S_CNT<5:1> while the complementary period signal RUNDB is disabled to have a logic "high" level. The first set control circuit 310 may output the first bit datum S_CNT<1> having a logic "low" level if the complementary period signal RUNDB is enabled to have a logic "low" level. The first reset control circuit 311 may buffer the first bit datum INT<1> of the initialization signal INT<5:1> to generate the first bit datum RS_CNT<1> of the reset control signal RS_CNT<5:1> while the period signal RUND is disabled to have a logic "low" level. The first reset control circuit 311 may output the first bit datum RS_CNT<1> having a logic "high" level if the period signal RUND is enabled to have a logic "high" level.

The second set control circuit 312 may buffer the second bit datum INT<2> of the initialization signal INT<5:1> to generate the second bit datum S_CNT<2> of the set control signal S_CNT<5:1> while the complementary period signal RUNDB is disabled to have a logic "high" level. The second set control circuit 312 may output the second bit datum S_CNT<2> having a logic "low" level if the complementary period signal RUNDB is enabled to have a logic "low" level. The second reset control circuit 313 may buffer the second bit datum INT<2> of the initialization signal INT<5:1> to generate the second bit datum RS_CNT<2> of the reset control signal RS_CNT<5:1> while the period signal RUND is disabled to have a logic "low" level. The second reset control circuit 313 may output the second bit datum RS_CNT<2> having a logic "high" level if the period signal RUND is enabled to have a logic "high" level.

The third set control circuit 314 may buffer the third bit datum INT<3> of the initialization signal INT<5:1> to generate the third bit datum S_CNT<3> of the set control signal S_CNT<5:1> while the complementary period signal RUNDB is disabled to have a logic "high" level. The third set control circuit 314 may output the third bit datum S_CNT<3> having a logic "low" level if the complementary period signal RUNDB is enabled to have a logic "low" level. The third reset control circuit 315 may buffer the third bit datum INT<3> of the initialization signal INT<5:1> to generate the third bit datum RS_CNT<3> of the reset control signal RS_CNT<5:1> while the period signal RUND is disabled to have a logic "low" level. The third reset control circuit 315 may output the third bit datum RS_CNT<3> having a logic "high" level if the period signal RUND is enabled to have a logic "high" level.

The fourth set control circuit 316 may buffer the fourth bit datum INT<4> of the initialization signal INT<5:1> to generate the fourth bit datum S_CNT<4> of the set control signal S_CNT<5:1> while the complementary period signal RUNDB is disabled to have a logic "high" level. The fourth set control circuit 316 may output the fourth bit datum S_CNT<4> having a logic "low" level if the complementary period signal RUNDB is enabled to have a logic "low" level. The fourth reset control circuit 317 may buffer the fourth bit datum INT<4> of the initialization signal INT<5:1> to generate the fourth bit datum RS_CNT<4> of the reset control signal RS_CNT<5:1> while the period signal RUND is disabled to have a logic "low" level. The fourth reset control circuit 317 may output the fourth bit datum RS_CNT<4> having a logic "high" level if the period signal RUND is enabled to have a logic "high" level.

The fifth set control circuit 318 may buffer the fifth bit datum INT<5> of the initialization signal INT<5:1> to generate the fifth bit datum S_CNT<5> of the set control signal S_CNT<5:1> while the complementary period signal RUNDB is disabled to have a logic "high" level. The fifth set control circuit 318 may output the fifth bit datum S_CNT<5> having a logic "low" level if the complementary period signal RUNDB is enabled to have a logic "low" level. The fifth reset control circuit 319 may buffer the fifth bit datum INT<5> of the initialization signal INT<5:1> to generate the fifth bit datum RS_CNT<5> of the reset control signal RS_CNT<5:1> while the period signal RUND is disabled to have a logic "low" level. The fifth reset control circuit 319 may output the fifth bit datum RS_CNT<5> having a logic "high" level if the period signal RUND is enabled to have a logic "high" level.

The counter control circuit 31 may buffer the initialization signal INT<5:1> to output the buffered initialization signal INT<5:1> as the set control signal S_CNT<5:1> and the reset control signal RS_CNT<5:1> while the period signal RUND is disabled to have a logic "low" level. The counter control circuit 31 may output the set control signal S_CNT<5:1> including the first to fifth bit data set to have a logic "low" level and the reset control signal RS_CNT<5:

1> including the first to fifth bit data set to have a logic "high" level, if the period signal RUND is enabled to have a logic "high" level.

Figure 7:
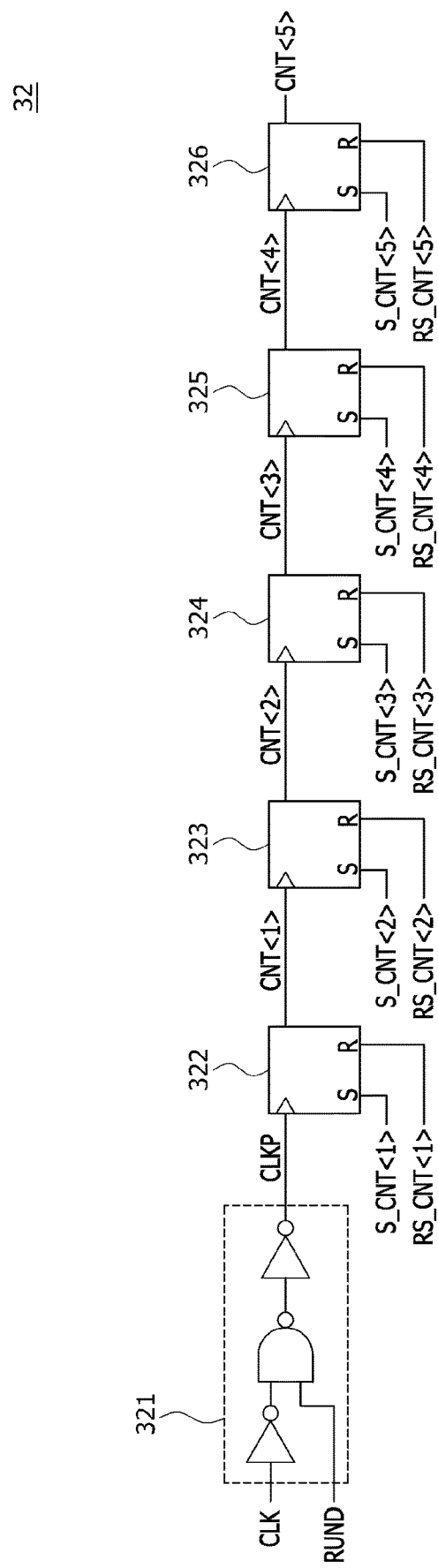
FIG. 7 is a circuit diagram illustrating an example of a count signal generation circuit included in the judgement pulse generation circuit of FIG. 5.

Referring to FIG. 7, the count signal generation circuit 32 may include a clock pulse generation circuit 321, a first count latch 322, a second count latch 323, a third count latch 324, a fourth count latch 325 and a fifth count latch 326.

The clock pulse generation circuit 321 may generate the clock pulse CLKP in response to the period signal RUND and the clock signal CLK. The clock pulse generation circuit 321 may inversely buffer the clock signal CLK to generate the clock pulse CLKP while the period signal RUND is enabled to have a logic "high" level. The clock pulse generation circuit 321 may generate the clock pulse CLKP having a rising edge which is created in synchronization with a falling edge of the clock signal CLK during a time period that the period signal RUND is enabled to have a logic "high" level. The falling edge means a point of time that a level of a certain signal is changed from a logic "high" level into a logic "low" level, and the rising edge means a point of time that a level of the certain signal is changed from a logic "low" level into a logic "high" level. In an embodiment, for example, the clock pulse generation circuit 321 may include an inverter for receiving the clock signal CLK and outputting a resultant signal to a NAND gate, the NAND gate configured to receive the resultant signal and the period signal RUND and output another resultant signal to another inverter to output the clock pulse signal CLKP.

The first count latch 322 may output the first bit datum CNT<1> of the count signal CNT<5:1>, which is set to have the same logic level as the first bit datum S_CNT<1> of the set control signal S_CNT<5:1> or the first bit datum RS_CNT<1> of the reset control signal RS_CNT<5:1>, while the period signal RUND is disabled to have a logic "low" level. While the period signal RUND is disabled to have a logic "low" level, the first bit datum S_CNT<1> of the set control signal S_CNT<5:1> and the first bit datum RS_CNT<1> of the reset control signal RS_CNT<5:1> may be set to have the same logic level. The first count latch 322 may invert a logic level of the first bit datum CNT<1> of the count signal CNT<5:1> in synchronization with a point of time that the clock pulse CLKP is generated.

The second count latch 323 may output the second bit datum CNT<2> of the count signal CNT<5:1>, which is set to have the same logic level as the second bit datum S_CNT<2> of the set control signal S_CNT<5:1> or the second bit datum RS_CNT<2> of the reset control signal RS_CNT<5:1>, while the period signal RUND is disabled to have a logic "low" level. While the period signal RUND is disabled to have a logic "low" level, the second bit datum S_CNT<2> of the set control signal S_CNT<5:1> and the second bit datum RS_CNT<2> of the reset control signal RS_CNT<5:1> may be set to have the same logic level. The second count latch 323 may invert a logic level of the second bit datum CNT<2> of the count signal CNT<5:1> in synchronization with a rising edge of the first bit datum CNT<1> of the count signal CNT<5:1>.

The third count latch 324 may output the third bit datum CNT<3> of the count signal CNT<5:1>, which is set to have the same logic level as the third bit datum S_CNT<3> of the set control signal S_CNT<5:1> or the third bit datum RS_CNT<3> of the reset control signal RS_CNT<5:1>, while the period signal RUND is disabled to have a logic "low" level. While the period signal RUND is disabled to have a logic "low" level, the third bit datum S_CNT<3> of the set control signal S_CNT<5:1> and the third bit datum RS_CNT<3> of the reset control signal RS_CNT<5:1> may be set to have the same logic level. The third count latch 324 may invert a logic level of the third bit datum CNT<3> of the count signal CNT<5:1> in synchronization with a rising edge of the second bit datum CNT<2> of the count signal CNT<5:1>.

The fourth count latch 325 may output the fourth bit datum CNT<4> of the count signal CNT<5:1>, which is set to have the same logic level as the fourth bit datum S_CNT<4> of the set control signal S_CNT<5:1> or the fourth bit datum RS_CNT<4> of the reset control signal RS_CNT<5:1>, while the period signal RUND is disabled to have a logic "low" level. While the period signal RUND is disabled to have a logic "low" level, the fourth bit datum S_CNT<4> of the set control signal S_CNT<5:1> and the fourth bit datum RS_CNT<4> of the reset control signal RS_CNT<5:1> may be set to have the same logic level. The fourth count latch 325 may invert a logic level of the fourth bit datum CNT<4> of the count signal CNT<5:1> in synchronization with a rising edge of the third bit datum CNT<3> of the count signal CNT<5:1>.

The fifth count latch 326 may output the fifth bit datum CNT<5> of the count signal CNT<5:1>, which is set to have the same logic level as the fifth bit datum S_CNT<5> of the set control signal S_CNT<5:1> or the fifth bit datum RS_CNT<5> of the reset control signal RS_CNT<5:1>, while the period signal RUND is disabled to have a logic "low" level. While the period signal RUND is disabled to have a logic "low" level, the fifth bit datum S_CNT<5> of the set control signal S_CNT<5:1> and the fifth bit datum RS_CNT<5> of the reset control signal RS_CNT<5:1> may be set to have the same logic level. The fifth count latch 326 may invert a logic level of the fifth bit datum CNT<5> of the count signal CNT<5:1> in synchronization with a rising edge of the fourth bit datum CNT<4> of the count signal CNT<5:1>.

The count signal generation circuit 32 may output the count signal CNT<5:1> having an initial logic level combination which is consistent with a logic level combination of the set control signal S_CNT<5:1> or a logic level combination of the reset control signal RS_CNT<5:1> while the period signal RUND is disabled to have a logic "low" level. The count signal generation circuit 32 may output the count signal CNT<5:1> that is sequentially counted in synchronization with falling edges of the clock signal CLK while the period signal RUND is enabled to have a logic "high" level. The count signal CNT<5:1> may be sequentially counted down such that a logic level combination of the count signal CNT<5:1> decreases bit by bit.

Figure 8:
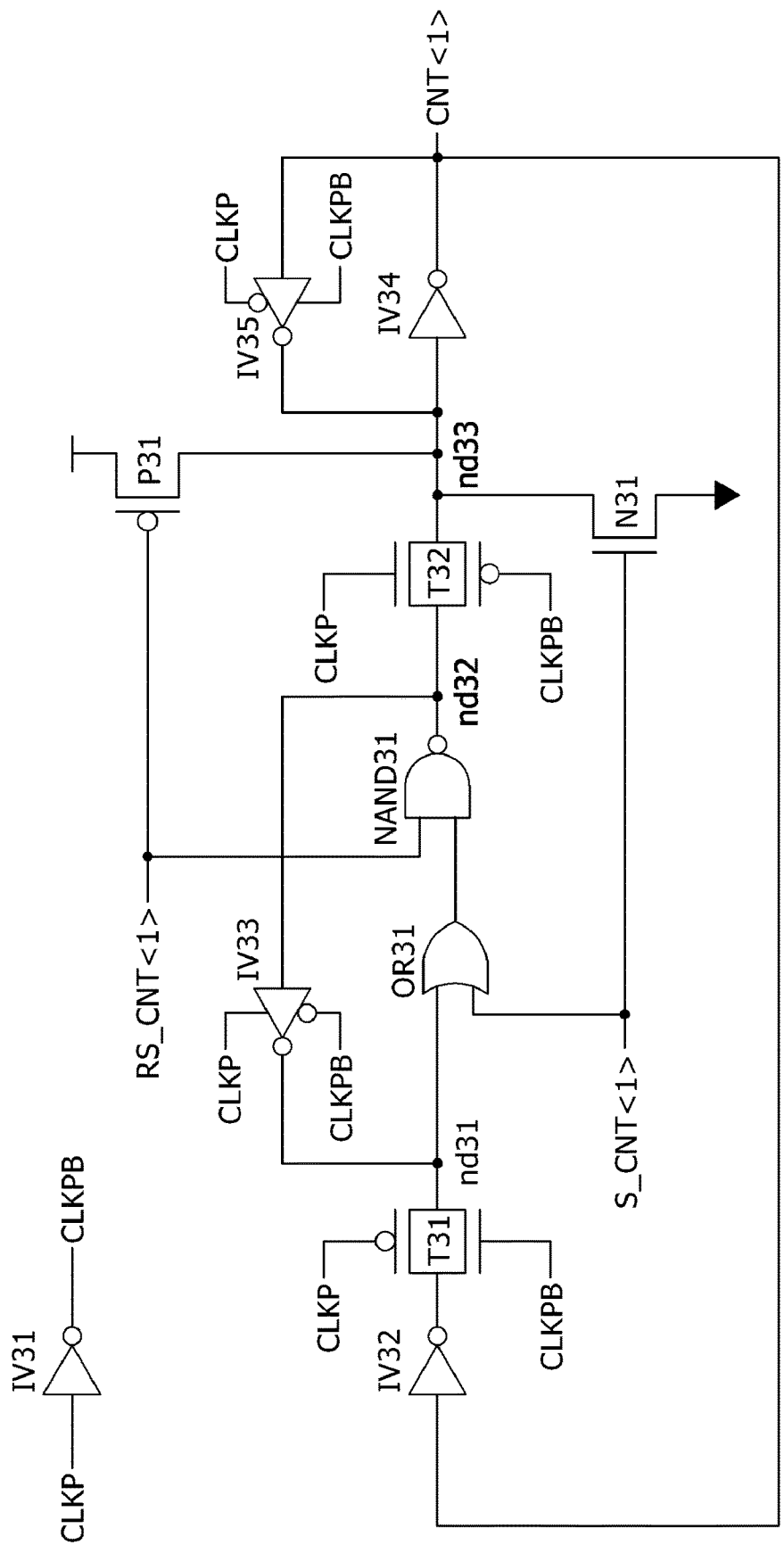
FIG. 8 is a circuit diagram illustrating an example of a first count latch included in the count signal generation circuit of FIG. 7.

Referring to FIG. 8, the first count latch 322 may include inverters IV31, IV32, IV33, IV34 and IV35, transfer gates T31 and T32, OR gate OR31, a NAND gate NAND31, a PMOS transistor P31, and an NMOS transistor N31.

The inverter IV31 may inversely buffer the clock pulse CLKP to generate a complementary clock pulse CLKPB. The inverter IV32 may inversely buffer the first bit datum CNT<1> of the count signal CNT<5:1> to output the inversely buffered first bit datum CNT<1>. The transfer gate T31 may be synchronized with a falling edge of the clock pulse CLKP to receive an output signal of the inverter IV32 and to output the output signal of the inverter IV32 to a node nd31. The OR gate OR31 and the NAND gate NAND31 may inversely buffer a signal of the node nd31 to output the inversely buffered signal to a node nd32, if the first bit datum S_CNT<1> of the set control signal S_CNT<5:1> has a logic "low" level and the first bit datum RS_CNT<1> of the reset control signal RS_CNT<5:1> has a logic "high" level. The inverter IV33 may inversely buffer a signal of the node nd32 to output the inversely buffered signal to the node nd31, in synchronization with a rising edge of the clock pulse CLKP. The transfer gate T32 may be synchronized with a rising edge of the clock pulse CLKP to output a signal of the node nd32 to a node nd33. The inverter IV34 may inversely buffer a signal of the node nd33 to output the inversely buffered signal as the first bit datum CNT<1> of the count signal CNT<5:1>. The inverter IV35 may inversely buffer the first bit datum CNT<1> of the count signal CNT<5:1> to output the inversely buffered first bit datum CNT<1> to the node nd33, in synchronization with a falling edge of the clock pulse CLKP. The PMOS transistor P31 may be turned on to drive a level of the node nd33 to a logic "high" level if the first bit datum RS_CNT<1> of the reset control signal RS_CNT<5:1> has a logic "low" level. The NMOS transistor PN1 may be turned on to drive a level of the node nd33 to a logic "low" level if the first bit datum S_CNT<1> of the set control signal S_CNT<5:1> has a logic "high" level.

The first count latch 322 may drive the node nd33 with the PMOS transistor P31 turned on according to a logic level of the first bit datum S_CNT<1> of the set control signal S_CNT<5:1> or the NMOS transistor N31 turned on according to a logic level of the first bit datum RS_CNT<1> of the reset control signal RS_CNT<5:1> to set a logic level of the first bit datum CNT<1> of the count signal CNT<5:1>, while the period signal RUND is disabled not to generate the clock pulse CLKP. The first count latch 322 may be synchronized with a falling edge of the clock pulse CLKP to latch the first bit datum CNT<1> of the count signal CNT<5:1> and to inversely buffer the first bit datum CNT<1> of the count signal CNT<5:1> to output the inversely buffered first bit datum CNT<1> to the node nd31. The first count latch 322 may be synchronized with a rising edge of the clock pulse CLKP to latch a signal of the node nd31 and to buffer the signal of the node nd31 to generate the first bit datum CNT<1> of the count signal CNT<5:1>.

The second count latch 323 may be configured in the same way as the first count latch 322 except that the designations of the signals inputted thereto and outputted therefrom are different. For example, the CNT<1> may take the place of clock pulse CLKP, the second bit datum S_CNT<2> and RS_CNT<2> may take the place of first bit datum S_CNT<1> and RS_CNT<1> for the second count latch 323 to output the second bit datum CNT<2>. The third count latch 324 may be configured in the same way as the first count latch 322 except that the designations of the signals inputted thereto and outputted therefrom are different. For example, the CNT<2> may take the place of clock pulse CLKP, the third bit datum S_CNT<3> and RS_CNT<3> may take the place of first bit datum S_CNT<1> and RS_CNT<1> for the third count latch 324 to output the third bit datum CNT<3>. The fourth count latch 325 may be configured in the same way as the first count latch 322 except that the designations of the signals inputted thereto and outputted therefrom are different. For example, the CNT<3> may take the place of clock pulse CLKP, the fourth bit datum S_CNT<4> and RS_CNT<4> may take the place of first bit datum S_CNT<1> and RS_CNT<1> for the fourth count latch 325 to output the fourth bit datum CNT<4>. The fifth count latch 326 may be configured in the same way as the first count latch 322 except that the designations of the signals inputted thereto and outputted therefrom are different. For example, the CNT<4> may take the place of clock pulse CLKP, the fifth bit datum S_CNT<5> and RS_CNT<5> may take the place of first bit datum S_CNT<1> and RS_CNT<1> for the fifth count latch 326 to output the fifth bit datum CNT<5>.

Figure 9:
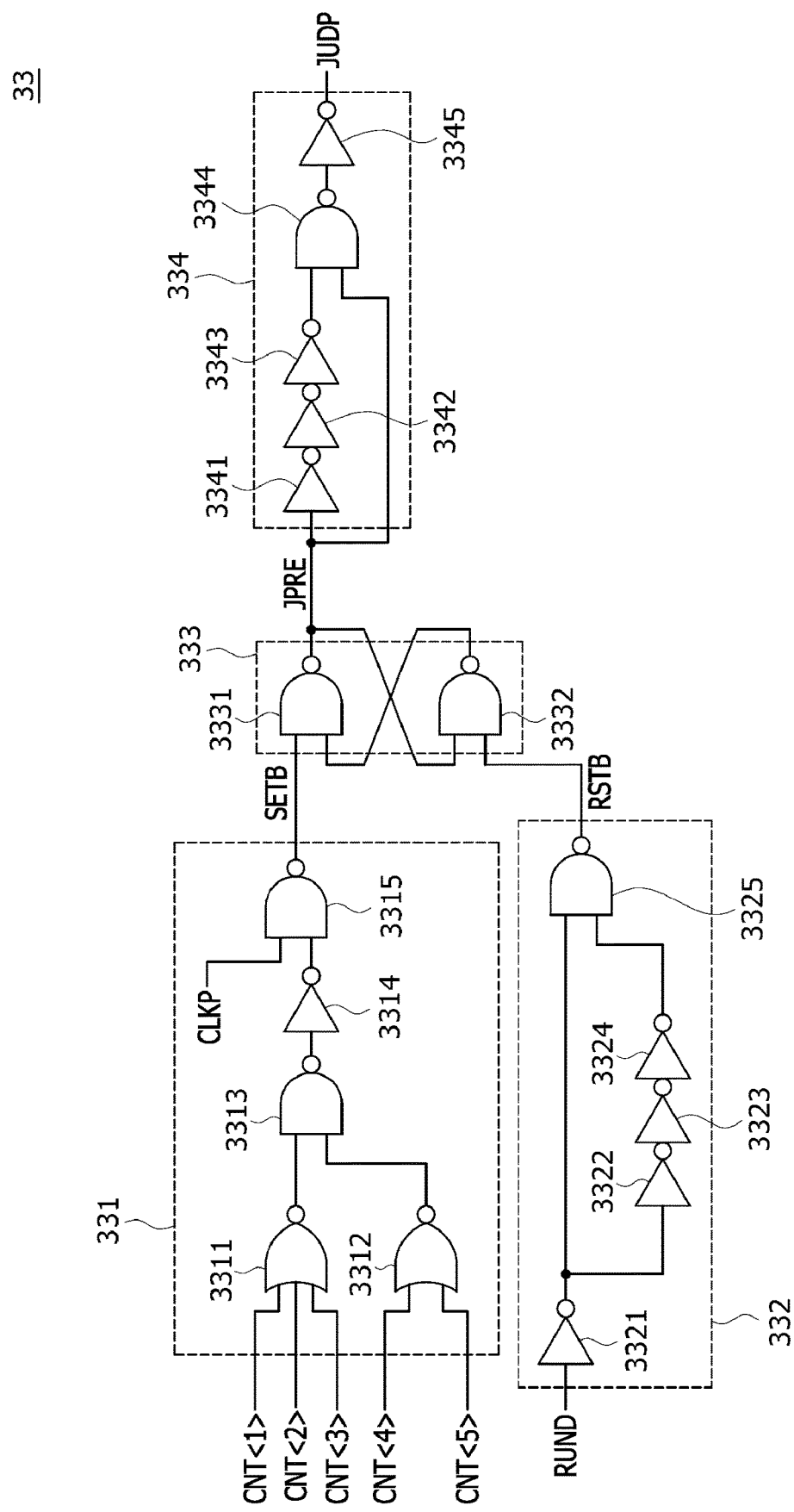
FIG. 9 is a circuit diagram illustrating an example of a count signal detection circuit included in the judgement pulse generation circuit of FIG. 5.

Referring to FIG. 9, the count signal detection circuit 33 may include a set signal generation circuit 331, a reset signal generation circuit 332, an initial judgement signal generation circuit 333 and a judgement pulse output circuit 334. The count signal detection circuit 33 may generate the judgement pulse JUDP if all of bits included in the count signal CNT<5:1> have a logic "low" level.

The set signal generation circuit 331 may generate a set signal SETB in response to the clock pulse CLKP and the count signal CNT<5:1>. The set signal generation circuit 331 may generate the set signal SETB which is enabled to have a logic "low" level if the count signal CNT<5:1> has a predetermined target logic level combination during a time period that the clock pulse CLKP is generated. The predetermined target logic level combination of the count signal CNT<5:1> may mean that all of bits included in the count signal CNT<5:1> have a logic "low" level.

The set signal generation circuit may include first to fifth logic gates 3311 to 3315.

The first logic gate 3311 may perform a NOR operation on the first to third count signal bits CNT<1:3> and output a resultant signal. The second logic gate 3312 may perform a NOR operation on the fourth and fifth count signal bits CNT<4:5> and output a resultant signal. The third logic gate 3313 may perform a NOR operation on the resultant signals outputted from the first and second logic gates 3311 and 3312 and output a resultant signal. The fourth logic gate 3314 may invert the outputted resultant signal of the third logic gate 3313 and output a resultant signal. The fifth logic gate 3315 may perform a NAND operation with the clock pulse and the resultant signal outputted from the fourth logic gate 3314 to output the set signal 3315.

The reset signal generation circuit 332 may generate a reset signal RSTB in response to the period signal RUND. The reset signal generation circuit 332 may be synchronized with a falling edge of the period signal RUND to generate the reset signal RSTB which is enabled to have a logic "low" level.

The reset signal generation circuit 332 may include first to fifth logic gates 3321 to 3325.

The first logic gate 3321 may invert the period signal to output a resultant signal. The second to fourth logic gates 3322 to 3324, which are a delay circuit including inverters, may delay the resultant signal outputted from the first logic gate 3321 by a preset time. The fifth logic gate 3325 may perform a NAND operation on the output of the delay circuit and the resultant signal outputted from the first logic gate 3321 to output a reset signal RSTB.

The initial judgement signal generation circuit 333 may generate an initial judgement signal JPRE in response to the set signal SETB and the reset signal RSTB. The initial judgement signal JPRE may be enabled to have a logic "high" level if the set signal SETB is enabled to have a logic "low" level and may be disabled to have a logic "low" level if the reset signal RSTB is enabled to have a logic "low" level.

The initial judgement signal generation circuit 333 may include first to second logic gates 3331 and 3332. The first and second logic gates 3331 and 3332 may be coupled to one another to form an SR Latch of the NAND type. The first logic gate 3331 may perform a NAND operation on the output of the second logic gate 3332 and the set signal SETB to output the initial judgement signal JPRE. The second logic gate 3332 may perform a NAND operation on the output of the first logic gate 3331 and the reset signal RSTB to output a resultant signal to the first logic gate 3331.

The judgement pulse output circuit 334 may generate the judgement pulse JUDP in response to the initial judgement signal JPRE. The judgement pulse output circuit 334 may generate the judgement pulse JUDP in synchronization with a rising edge of the initial judgement signal JPRE.

The judgement pulse output circuit 334 may include first to fifth logic gates 3341 to 3345.

The first to third logic gates 3341 to 3343, which are a delay circuit including inverters, may delay the initial judgement signal JPRE by a preset time. The fourth logic gate 3344 may perform a NAND operation on the output of the delay circuit and the initial judgement signal JPRE to output a resultant signal. The fifth logic gate 3345 may invert the resultant signal of the fourth logic gate 3344 to output the judgement pulse JUDP.

Figure 10:
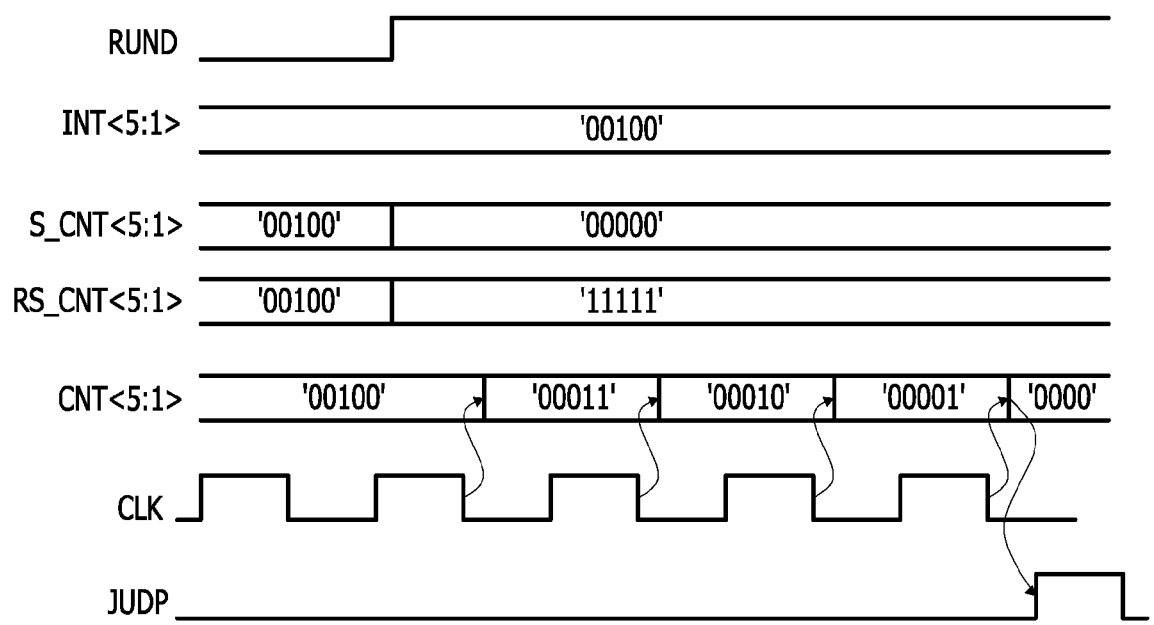
FIG. 10 is a timing diagram illustrating an operation of the judgement pulse generation circuit illustrated in FIG. 5.

An operation of the judgement pulse generation circuit 3 will be described hereinafter with reference to FIG. 10.

While the period signal RUND is disabled to have a logic "low" level, each of the set control signal S_CNT<5:1> and the reset control signal RS_CNT<5:1> may be set to have a logic level combination of '00100' which is consistent with a logic level combination of the initialization signal INT<5:1>. In the initialization signal INT<5:1>, a logic level combination of '00100' means that only the third bit datum INT<3> has a logic "high" level and the first and second bit data INT<1:2> and the fourth and fifth bit data INT<4:5> have a logic "low" level.

If the period signal RUND is enabled to have a logic "high" level, all of the bits included in the set control signal S_CNT<5:1> may be set to have a logic "low" level and all of the bits included in the reset control signal RS_CNT<5:1> may be set to have a logic "high" level. While the period signal RUND is enabled to have a logic "high" level, the count signal CNT<5:1> may be counted in synchronization with a falling edge of the clock signal CLK. Whenever the count signal CNT<5:1> is counted, a logic level combination of the count signal CNT<5:1> may decrease bit by bit from the predetermined initial logic level combination of '00100'. That is, the count signal CNT<5:1> may be sequentially counted down bit by bit in synchronization with falling edges of the clock signal CLK to have logic level combinations of '00100', '00011', '00010', '00001' and '00000' in sequence. If the count signal CNT<5:1> has a logic level combination of '00000', the judgement pulse JUDP may be generated.

Figure 11:
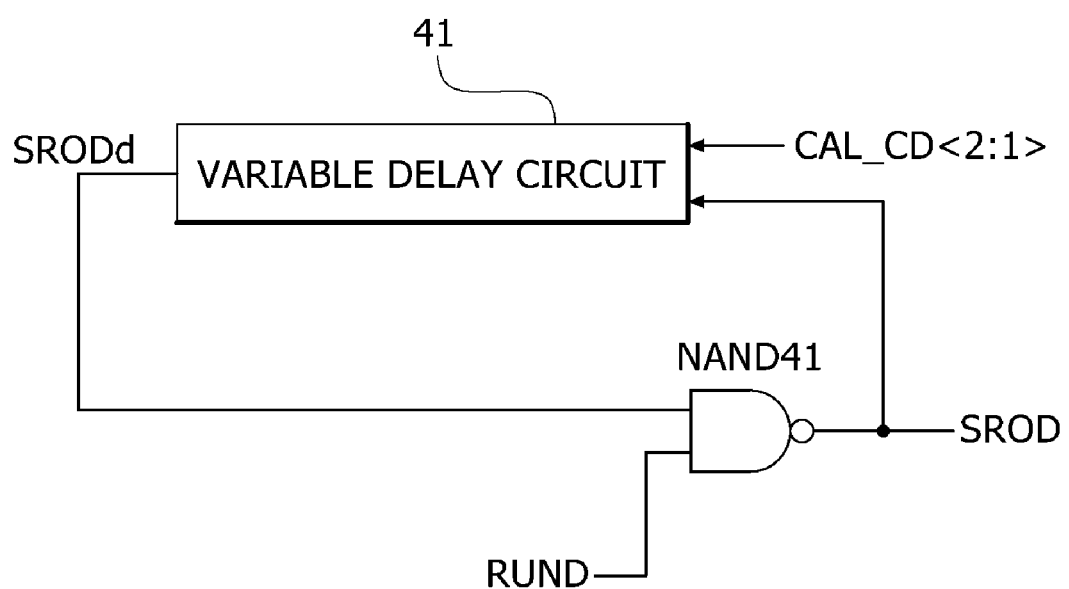
FIG. 11 illustrates an example of a reference signal generation circuit included in the cycle control circuit of FIG. 1.

Referring to FIG. 11, the reference signal generation circuit 4 may include a variable delay circuit 41 and a NAND gate NAND41. The variable delay circuit 41 may delay the reference signal SROD by a delay time corresponding to the calibration code CAL_CD<2:1> to generate and output a delayed reference signal SRODd. The NAND gate NAND41 may inversely buffer the delayed reference signal SRODd to generate the reference signal SROD while the period signal RUND is enabled to have a logic "high" level. The reference signal generation circuit 4 may generate the reference signal SROD corresponding to a periodic signal having a cycle that is controlled according to a logic level combination of the calibration code CAL_CD<2:1>. The variable delay circuit 41 may be realized to include resistors and capacitors, and a delay time of the variable delay circuit 41 may be controlled by adjusting a resistance value and a capacitance value according to a logic level combination of the calibration code CAL_CD<2:1>.

Figure 12:
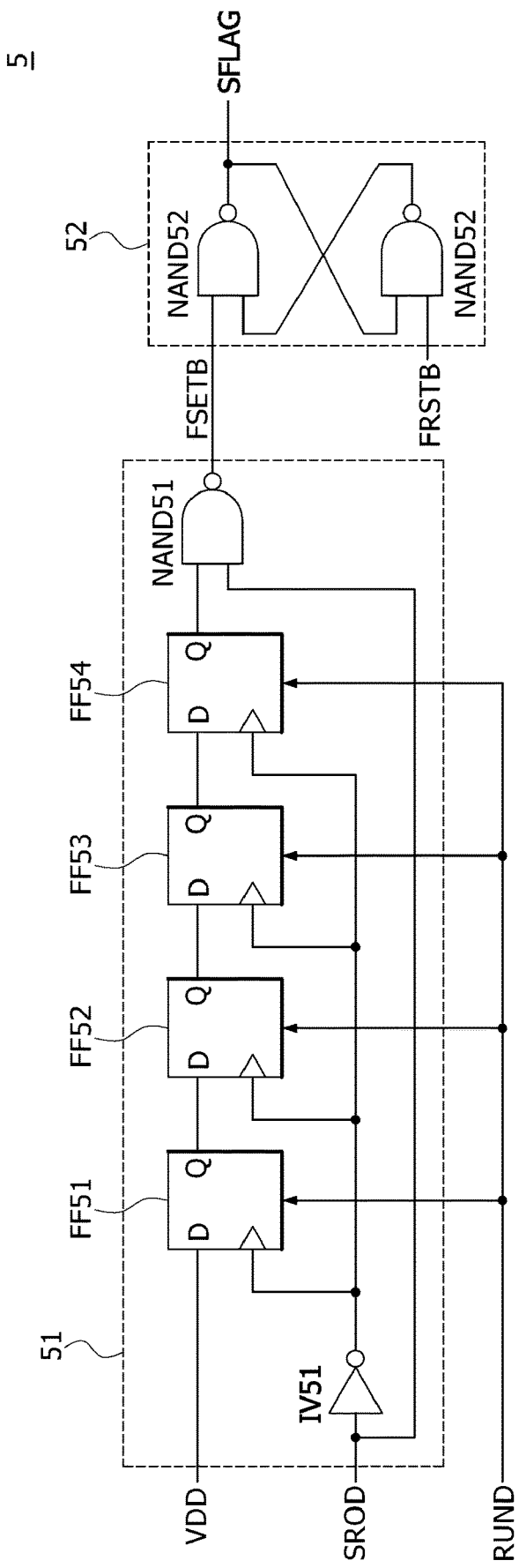
FIG. 12 is a circuit diagram illustrating an example of a flag generation circuit included in the cycle control circuit of FIG. 1.

Referring to FIG. 12, the flag generation circuit 5 may include a fuse set signal generation circuit 51 and a flag latch 52. The flag generation circuit 5 may generate the reference flag SFLAG in synchronization with a point of time that a time period corresponding to four cycles of the reference signal SROD elapses after the period signal RUND is enabled. The time period corresponding to four cycles of the reference signal SROD means four times a cycle of the reference signal SROD. However, the embodiments are not limited to a time period corresponding to four cycles and more or less cycles may be used to provide a time period corresponding to a predetermined number of cycles of the reference signal SROD.

The fuse set signal generation circuit 51 may include an inverter IV51, first to fourth flip-flops FF51~FF54 and a NAND gate NAND51. The inverter IV51 may inversely buffer the reference signal SROD to apply the inversely buffered reference signal SROD to the first to fourth flip-flops FF51~FF54. The first to fourth flip-flops FF51~FF54 may be initialized in synchronization with a point of time that the period signal RUND is enabled to output initialized signals having a logic "low" level. In an embodiment, for example, each flip flop FFS1 to FFS4 may include a D Flip-Flop configured to be initialized in response to the period signal RUND. The first to fourth flip-flops FF51~FF54 may sequentially latch a power supply voltage VDD in synchronization with falling edges of the reference signal SROD to output the latched power supply voltage VDD. That is, the first flip-flop FF51 may be synchronized with a first falling edge of the reference signal SROD to output a signal having a logic "high" level, the second flip-flop FF52 may be synchronized with a second falling edge of the reference signal SROD to output a signal having a logic "high" level, the third flip-flop FF53 may be synchronized with a third falling edge of the reference signal SROD to output a signal having a logic "high" level, and the fourth flip-flop FF54 may be synchronized with a fourth falling edge of the reference signal SROD to output a signal having a logic "high" level. The NAND gate NAND51 may generate a fuse set signal FSETB which is enabled to have a logic "low" level if an output signal of the fourth flip-flop FF54 and the reference signal SROD have a logic "high" level. The fuse set signal generation circuit 51 may generate the fuse set signal FSETB which is enabled to have a logic "low" level in synchronization with a fourth falling edge of the reference signal SROD after the period signal RUND is enabled.

The flag latch 52 may include NAND gates NAND52 and NAND53. The flag latch 52 may generate the reference flag SFLAG in response to the fuse set signal FSETB and a fuse reset signal FRSTB. In an embodiment, for example, the NAND gates NAND52 and NAND53 may be coupled to one another to form an SR Latch of the NAND type as illustrated. The flag latch 52 may generate the reference flag SFLAG which is enabled to have a logic "high" level if the fuse set signal FSETB is enabled to have a logic "low" level. The flag latch 52 may generate the reference flag SFLAG which is disabled to have a logic "low" level if the fuse reset signal FRSTB is enabled to have a logic "low" level. The fuse reset signal FRSTB may be provided by an external device.

Figure 13:
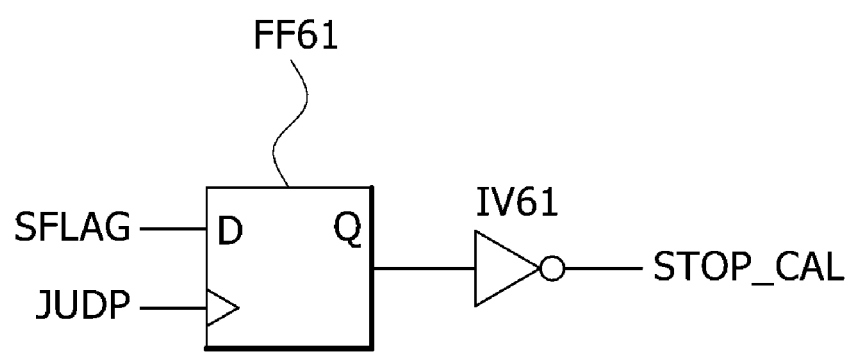
FIG. 13 is a circuit diagram illustrating an example of a detection signal generation circuit included in the cycle control circuit of FIG. 1.

Referring to FIG. 13, the detection signal generation circuit 6 may include a detection flip-flop FF61 and an inverter IV61. In an embodiment, for example, the detection flip-flop FF61 may be realized with a D flip flop configured to receive the judgement pulse with the clock terminal, to receive the reference flag signal SFLAG with the data D terminal, and to output the latched reference flag signal through the Q terminal. The detection flip-flop FF61 may receive and latch the reference flag SFLAG to output the latched reference flag SFLAG at a point of time that the judgement pulse JUDP is generated. The inverter IV61 may inversely buffer an output signal of the detection flip-flop FF61 to output the inversely buffered signal as the detection signal STOP_CAL. The detection signal generation circuit 6 may latch and buffer the reference flag SFLAG to output the latched and buffered reference flag SFLAG as the detection signal STOP_CAL, at a point of time that the judgement pulse JUDP is generated.

Figure 14:
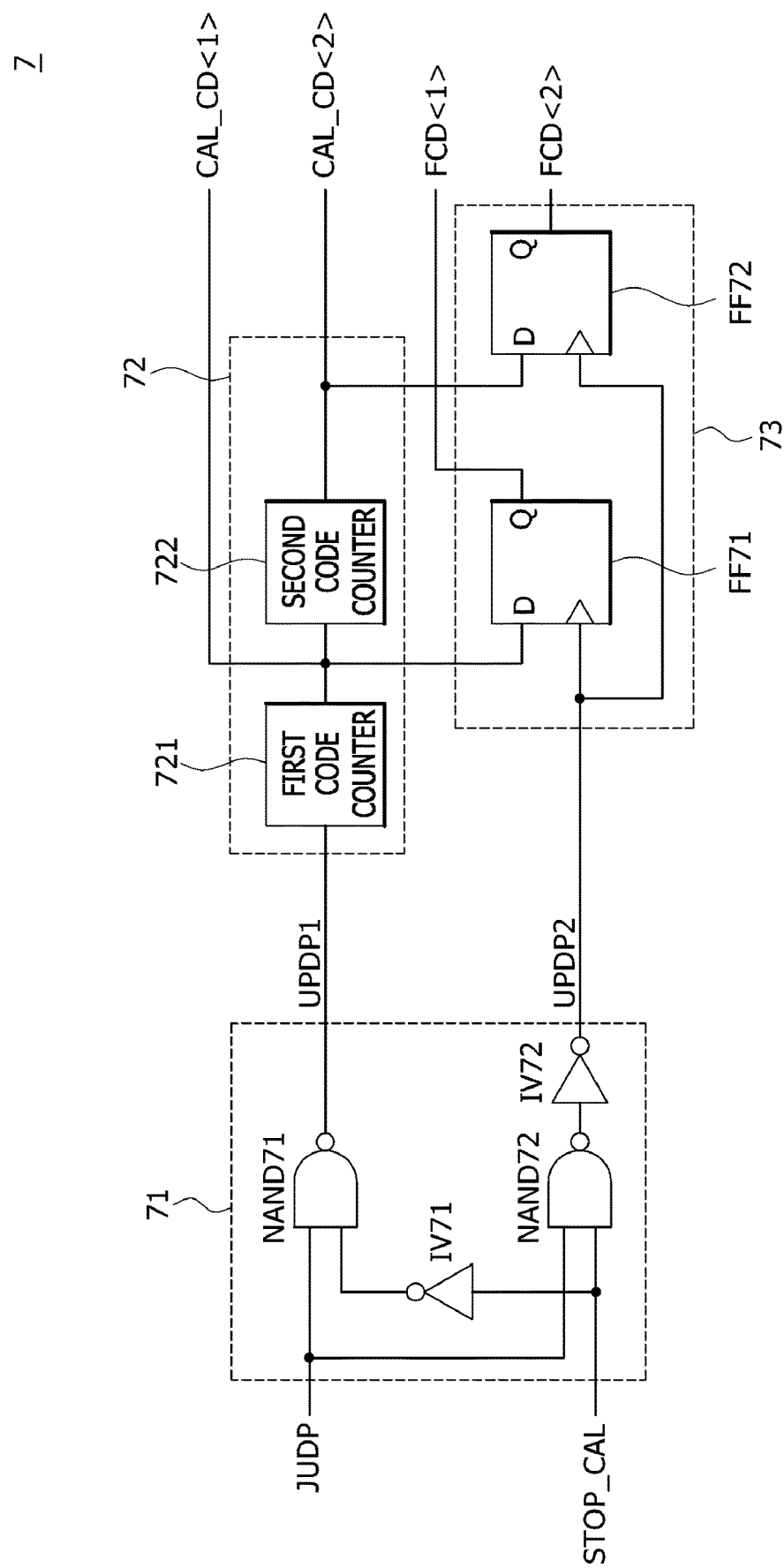
FIG. 14 is a circuit diagram illustrating an example of a code generation circuit included in the cycle control circuit of FIG. 1.

Referring to FIG. 14, the code generation circuit 7 may include an update pulse generation circuit 71, a first code output circuit 72 and a second code output circuit 73. The code generation circuit 7 may output the calibration code CAL_CD<2:1> that is counted if the judgement pulse JUDP is generated while the detection signal STOP_CAL has a logic "low" level. The code generation circuit 7 may output the calibration code CAL_CD<2:1> as the sense code FCD<2:1> if the judgement pulse JUDP is generated while the detection signal STOP_CAL has a logic "high" level.

The update pulse generation circuit 71 may include NAND gates NAND71 and NAND72 and inverters IV71 and IV72. The update pulse generation circuit 71 may generate a first update pulse UPDP1 if the judgement pulse JUDP is generated while the detection signal STOP_CAL has a logic "low" level. The update pulse generation circuit 71 may generate a second update pulse UPDP2 if the judgement pulse JUDP is generated while the detection signal STOP_CAL has a logic "high" level. In an embodiment, for example, the inverter IV71 may invert the detection signal STOP_CAL and the NAND gate NAND71 may perform a NAND operation on the inverted detection signal and the Judgement pulse JUDP to output the first update pulse UPDP1. In an embodiment, for example, the NAND gate NAND72 may perform a NAND operation on the judgement pulse JUDP and the detection signal STOP_CAL to output a resultant signal to the inverter IV72 which inverts the resultant signal to output the second update pulse UPDP2.

The first code output circuit 72 may include a first code counter 721 and a second code counter 722. The first code output circuit 72 may output the calibration code CAL_CD<2:1> that is counted in response to the first update pulse UPDP1. The first code output circuit 72 may output the calibration code CAL_CD<2:1> that is counted to have a logic level combination which is capable of increasing or decreasing a cycle of the reference signal SROD if the first update pulse UPDP1 is generated. In an embodiment, for example, the first code counter 721 may receive the first update pulse and output the first bit datum of the calibration code CAL_CD<1>, and the second code counter 722 may receive the first bit datum of the calibration code CAL_CD<1> and output the second bit datum of the calibration code CAL_CD<2>.

The second code output circuit 73 may include a first code flip-flop FF71 and a second code flip-flop FF72. The second code output circuit 73 may generate the sense code FCD<2:1> from the calibration code CAL_CD<2:1> in response to the second update pulse UPDP2. The second code output circuit 73 may generate and output the calibration code CAL_CD<2:1> as the sense code FCD<2:1> if the second update pulse UPDP2 is generated. The sense code FCD<2:1> may include information on a cycle of the reference signal SROD having a cycle that is controlled. A cycle of the reference signal SROD may be determined by a logic level combination of the sense code FCD<2:1>. In an embodiment, for example, the first code flip-flop FF71 may be realized with a D flip flop configured to receive the second update pulse UPDP2 with the clock terminal, to receive the first bit datum of the calibration code CAL_CD<1> with the data D terminal, and to output the first bit datum of the sense code FCD<1> through the Q terminal. In an embodiment, for example, the second code flip-flop FF72 may be realized with a D flip flop configured to receive the second update pulse UPDP2 with the clock terminal, to receive the second bit datum of the calibration code CAL_CD<2> with the data D terminal, and to output the second bit datum of the sense code FCD<2> through the Q terminal.

Operations of the cycle control circuit having an aforementioned configuration will be described hereinafter with reference to FIGS. 15 and 16.

Figure 15:
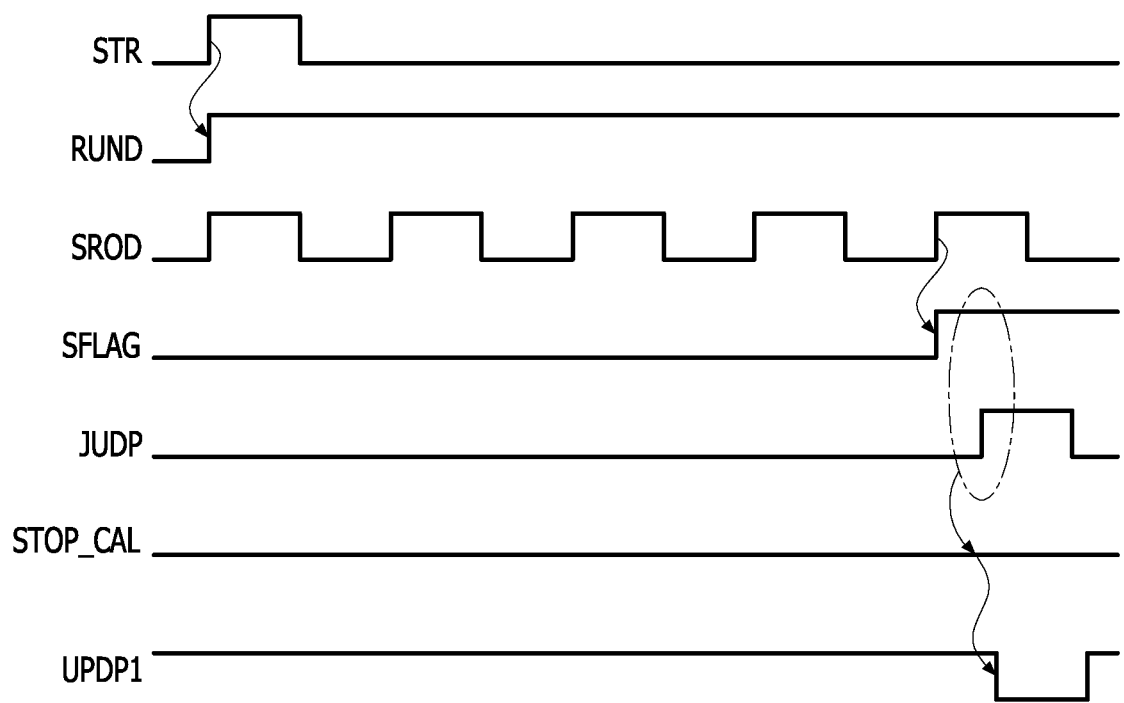
FIGS. 15 and 16 are timing diagrams illustrating operations of the cycle control circuit illustrated in FIG. 1.

As illustrated in FIG. 15, the reference flag SFLAG may be enabled to have a logic "high" level after four cycles of the reference signal SROD elapse from a point of time that the period signal RUND is enabled to have a logic "high" level according to the start signal STR. Since the reference flag SFLAG has a logic "high" level at a point of time that the judgement pulse JUDP is generated, the detection signal STOP_CAL may be generated to have a logic "low" level. Thus, the first update pulse UPDP1 may be generated by the detection signal STOP_CAL having a logic "low" level and the calibration code CAL_CD<2:1> may be counted to control a cycle of the reference signal SROD.

Figure 16:
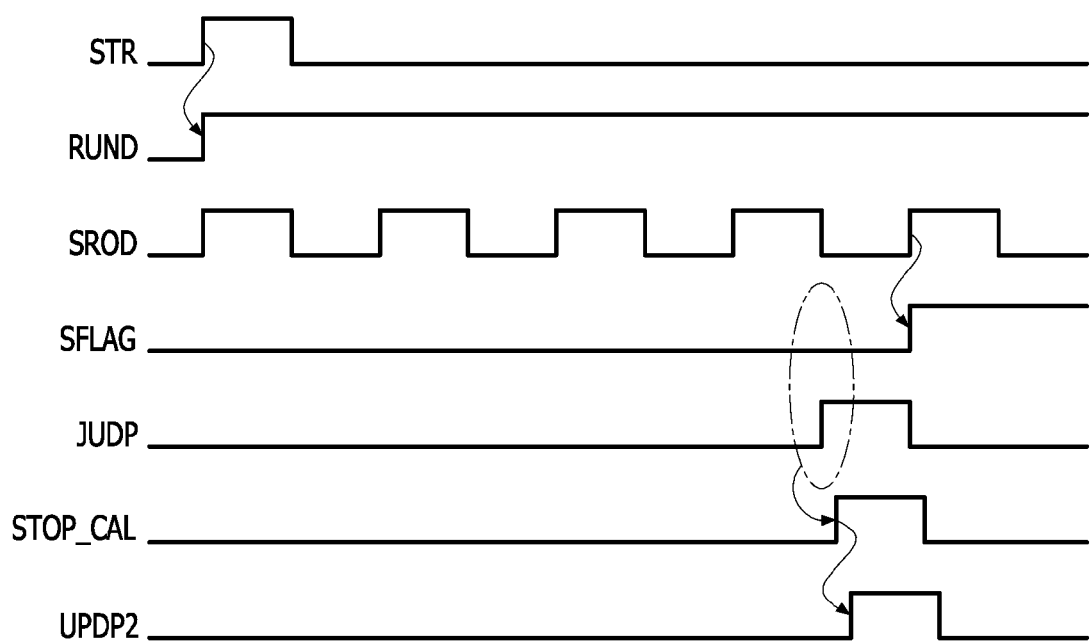

As illustrated in FIG. 16, the reference flag SFLAG may be enabled to have a logic "high" level after four cycles of the reference signal SROD elapse from a point of time that the period signal RUND is enabled to have a logic "high" level according to the start signal STR. Since the reference flag SFLAG has a logic "low" level at a point of time that the judgement pulse JUDP is generated, the detection signal STOP_CAL may be generated to have a logic "high" level. Thus, the second update pulse UPDP2 may be generated by the detection signal STOP_CAL having a logic "high" level and the calibration code CAL_CD<2:1> may be outputted as the sense code FCD<2:1>.

As described above, the cycle control circuit according to an embodiment may control a cycle of the reference signal SROD using the judgement pulse JUDP which is generated at a point of time that a time period corresponding to a predetermined number of cycles of the clock signal CLK elapses. Since the clock signal CLK is an external signal which is regularly toggled regardless of variation of characteristics of transistors included in the cycle control circuit, the clock signal CLK may have a constant cycle even though the characteristics of the transistors vary according to process/voltage/temperature (PVT) conditions. Thus, the cycle of the reference signal SROD, which is controlled by the clock signal CLK, is stably maintained to have a constant value regardless of a variation of the characteristics of the transistors. The cycle of the reference signal SROD may be determined by a logic level combination of the sense code FCD<2:1> generated after an operation for controlling the cycle of the reference signal SROD terminates.

Figure 17:
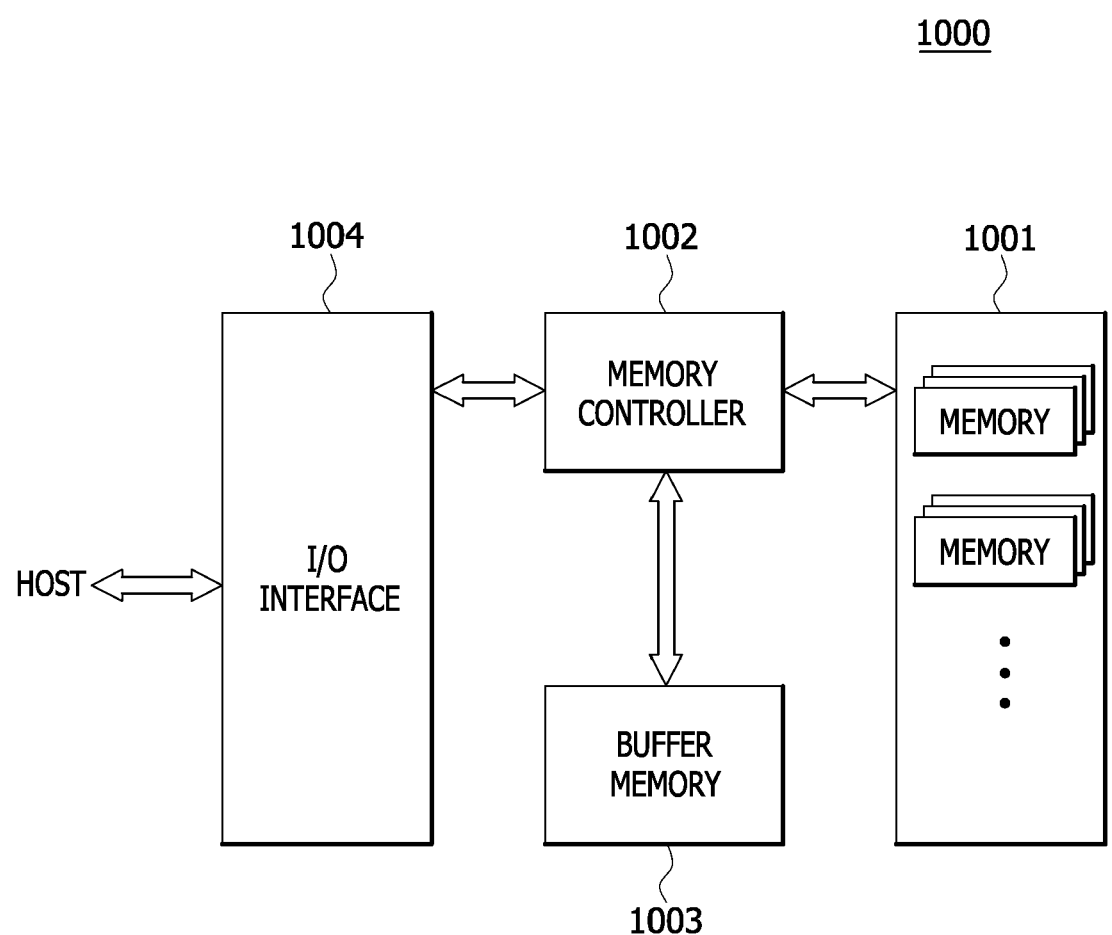
FIG. 17 is a block diagram illustrating a configuration of an electronic system including the cycle control circuit illustrated in FIG. 1.

The cycle control circuits described with reference to FIGS. 1 to 16 may be applied to an electronic system that includes a memory system, a graphic system, a computing system, a mobile system, or the like. For example, as illustrated in FIG. 17, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 17 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A cycle control circuit comprising:
    a judgement pulse generation circuit configured to set a predetermined value in response to an initialization signal and configured to generate a judgement pulse in synchronization with a point of time that a time period corresponding to the predetermined value in units of a cycle of a clock signal elapses;
    a detection signal generation circuit configured to generate a detection signal from a reference flag in response to the judgement pulse; and
    a code generation circuit configured to generate a calibration code for controlling a cycle of a reference signal in response to the detection signal and the judgement pulse,
    wherein the judgement pulse generation circuit is configured to initialize a count signal in response to a set control signal and a reset control signal which are generated from the initialization signal while a period signal is disabled and is configured to generate the judgement pulse by counting the count signal in response to a clock pulse which is generated from the clock signal while the period signal is enabled;
    wherein the count signal is initialized by the set control signal and the reset control signal to have an initial logic level combination; and
    wherein the count signal is sequentially counted from the initial logic level combination to a target logic level combination in response to the clock pulse.

2. The cycle control circuit of claim 1, wherein the initialization signal is generated from an information signal during a mode register write operation.

3. The cycle control circuit of claim 2,
    wherein the information signal includes mode information; and
    wherein the information signal is inputted to the cycle control circuit through a line that transmits an address or a command.

4. The cycle control circuit of claim 1, wherein the judgement pulse generation circuit includes a counter control circuit which is configured to generate the set control signal and the reset control signal in response to the initialization signal and a period signal.

5. The cycle control circuit of claim 4, wherein the judgement pulse generation circuit is configured to buffer the initialization signal to generate the set control signal and the reset control signal while the period signal is disabled and is configured to generate the set control signal and the reset control signal having predetermined logic level combinations while the period signal is enabled.

6. The cycle control circuit of claim 4, wherein the judgement pulse generation circuit further includes the count signal generation circuit which is configured to initialize all of bits included in a count signal in response to the set control signal and the reset control signal and is configured to output the count signal that is counted in response to the clock pulse.

7. The cycle control circuit of claim 6, wherein the judgement pulse generation circuit further includes a count signal detection circuit which is configured to generate the judgement pulse if the count signal has a predetermined target logic level combination.

8. The cycle control circuit of claim 7, wherein the count signal detection circuit includes:
    an initial judgement signal generation circuit configured to generate an initial judgement signal in response to a set signal and a reset signal, wherein the set signal is generated in response to the clock pulse and the count signal, and the reset signal is generated in response to the period signal; and
    a judgement pulse output circuit configured to generate the judgement pulse from the initial judgement signal.

9. The cycle control circuit of claim 1, wherein the detection signal generation circuit is configured to latch the reference flag in synchronization with a point of time that the judgement pulse is generated and is configured to generate the detection signal from the latched reference flag.

10. The cycle control circuit of claim 1, wherein the code generation circuit is synchronized with a point of time that the judgement pulse is generated to generate the calibration code if the detection signal has a first logic level and to output the calibration code as a sense code if the detection signal has a second logic level.

11. The cycle control circuit of claim 1, wherein the code generation circuit includes:
an update pulse generation circuit configured to generate a first update pulse and a second update pulse in response to the judgement pulse and the detection signal;
a first code output circuit configured to output the calibration code that is counted in synchronization with the first update pulse; and
a second code output circuit configured to output the calibration code as a sense code in synchronization with the second update pulse.

12. A cycle control circuit comprising:
a judgement pulse generation circuit configured to set a predetermined value in response to an initialization signal and configured to generate a judgement pulse in synchronization with a point of time that a time period corresponding to the predetermined value in units of a cycle of a clock signal elapses;
a flag generation circuit configured to generate a reference flag in response to a period signal and a reference signal, the reference signal having a cycle that is controlled by a calibration code; and
a code generation circuit configured to generate the calibration code and a sense code in response to the judgement pulse and a detection signal generated from the reference flag,
wherein the judgement pulse generation circuit is configured to initialize a count signal to have an initial logic level combination in response to a set control signal and a reset control signal which are generated from the initialization signal while the period signal is disabled and is configured to generate the judgement pulse by sequentially counting the count signal from the initial logic level combination to a target logic level combination in response to a clock pulse which is generated from the clock signal while the period signal is enabled.

13. The cycle control circuit of claim 12, wherein the initialization signal is generated from an information signal during a mode register write operation.

14. The cycle control circuit of claim 12, wherein the judgement pulse generation circuit includes:
a counter control circuit configured to generate the set control signal and the reset control signal in response to the initialization signal and the period signal;
a count signal generation circuit configured to initialize all of bits included in the count signal in response to the set control signal and the reset control signal and configured to output the count signal that is counted in response to the clock pulse; and
a count signal detection circuit configured to generate the judgement pulse if the count signal has a target logic level combination.

15. The cycle control circuit of claim 12, wherein the flag generation circuit generates the reference flag in synchronization with a point of time that a time period corresponding to a predetermined number of cycles of the reference signal elapses after the period signal is enabled.

16. The cycle control circuit of claim 15, wherein the flag generation circuit includes:
a fuse set signal generation circuit configured to generate the fuse set signal in synchronization with the point of time that the time period corresponding to the predetermined number of cycles of the reference signal elapses after the period signal is enabled; and
a flag latch configured to generate the reference flag in response to the fuse set signal and a fuse reset signal.

17. The cycle control circuit of claim 12, further comprising a detection signal generation circuit configured to latch the reference flag in synchronization with a point of time that the judgement pulse is generated and configured to generate the detection signal from the latched reference flag.

18. The cycle control circuit of claim 12, wherein the code generation circuit is synchronized with a point of time that the judgement pulse is generated to generate the calibration code if the detection signal has a first logic level and to output the calibration code as a sense code if the detection signal has a second logic level.

19. The cycle control circuit of claim 12, wherein the code generation circuit includes:
an update pulse generation circuit configured to generate a first update pulse and a second update pulse in response to the judgement pulse and the detection signal;
a first code output circuit configured to output the calibration code that is counted in synchronization with the first update pulse; and
a second code output circuit configured to output the calibration code as a sense code in synchronization with the second update pulse.

20. A cycle control circuit comprising:
a judgement pulse generation circuit configured to set a predetermined value based on an initialization signal and a period signal, and configured to generate a judgement pulse in synchronization with a point of time that a time period corresponding to the predetermined value in units of a cycle of a clock signal elapses; and
a flag generation circuit configured to generate a reference flag based on the period signal and a reference signal,
wherein a cycle of the reference signal is maintained at a constant value after an operation for adjusting the cycle of the reference signal terminates based on the reference flag,
wherein the judgement pulse generation circuit is configured to initialize a count signal to have an initial logic level combination in response to a set control signal and a reset control signal which are generated from the initialization signal while the period signal is disabled and is configured to generate the judgement pulse by sequentially counting the count signal from the initial logic level combination to a target logic level combination in response to a clock pulse which is generated from the clock signal while the period signal is enabled.

21. The cycle control circuit of claim 20, further comprising:
a code generation circuit configured to increase or decrease the cycle of the reference signal in response to the judgement pulse and a detection signal generated from the reference flag.

22. The cycle control circuit of claim 21, wherein the code generation circuit is configured to maintain the cycle of the reference signal and output information on the cycle of the reference signal in response to the enablement of the detection signal generated from the reference flag.

23. A cycle control circuit comprising:
a judgement pulse generation circuit configured to set a predetermined value based on an initialization signal and a period signal, and configured to generate a judgement pulse in synchronization with a point of time that a time period corresponding to the predetermined value in units of a cycle of a clock signal elapses; and
a detection signal generation circuit configured to generate a detection signal from a reference flag in response to the judgement pulse, the reference flag generated based on a reference signal and the period signal,
wherein a cycle of the reference signal is maintained at a constant value after an operation for adjusting the cycle of the reference signal terminates based on the reference flag;
wherein the judgement pulse generation circuit is configured to initialize a count signal to have an initial logic level combination in response to a set control signal and a reset control signal which are generated from the initialization signal while the period signal is disabled and is configured to generate the judgement pulse by sequentially counting the count signal from the initial logic level combination to a target logic level combination in response to a clock pulse which is generated from the clock signal while the period signal is enabled.

24. The cycle control circuit of claim 23, further comprising:
a code generation circuit configured to increase or decrease the cycle of the reference signal in response to the judgement pulse and the detection signal.

25. The cycle control circuit of claim 24, wherein the code generation circuit is configured to maintain the cycle of the reference signal and output information on the cycle of the reference signal in response to the enablement of the detection signal.

26. The cycle control circuit of claim 23, further comprising:
a flag generation circuit configured to generate the reference flag signal in synchronization with a point of time that a time period corresponding to a predetermined number of cycles of the reference signal elapses after the period signal is enabled.

* * * * *